US006642496B1

(12) United States Patent
Gulbransen

(10) Patent No.: US 6,642,496 B1
(45) Date of Patent: Nov. 4, 2003

(54) TWO DIMENSIONAL OPTICAL SHADING GAIN COMPENSATION FOR IMAGING SENSORS

(75) Inventor: David J. Gulbransen, Santa Barbara, CA (US)

(73) Assignee: Raytheon Company, Lexington, MA (US)

(*) Notice: Subject to any disclaimer, the term of this patent is extended or adjusted under 35 U.S.C. 154(b) by 83 days.

(21) Appl. No.: 10/053,254

(22) Filed: Jan. 18, 2002

(51) Int. Cl.⁷ .......................... H01L 27/00; H01J 40/14
(52) U.S. Cl. .................. 250/208.1; 250/214 C
(58) Field of Search .................. 250/208.1, 214 R, 250/214 A, 214 LA, 214 C; 348/297, 300, 301, 302, 306; 356/221, 222, 226

(56) References Cited

U.S. PATENT DOCUMENTS

| | | | |
|---|---|---|---|
| 4,445,117 A | | 4/1984 | Gaalema et al. |
| 4,680,644 A | * | 7/1987 | Shirato et al. ............ 250/208.1 |
| 4,804,854 A | * | 2/1989 | Adachi et al. ............... 348/300 |
| 4,978,872 A | | 12/1990 | Morse et al. |
| 5,043,820 A | | 8/1991 | Wyles et al. |
| 5,083,016 A | | 1/1992 | Wyles et al. |
| 5,117,099 A | * | 5/1992 | Schmidt .................. 250/214 C |
| 5,945,663 A | * | 8/1999 | Bird ........................ 250/208.1 |
| 6,084,478 A | * | 7/2000 | Mayampurath ......... 250/214 A |
| 6,114,913 A | * | 9/2000 | Entrikin .................. 250/214 A |
| 6,121,843 A | * | 9/2000 | Vampola et al. ........ 250/214 A |
| 6,242,732 B1 | * | 6/2001 | Rantakari ............... 250/214 A |
| 6,252,462 B1 | * | 6/2001 | Hoffman ................. 250/214 A |
| 6,288,387 B1 | | 9/2001 | Black et al. |
| 6,384,689 B1 | * | 5/2002 | Kimura ................... 250/214 A |
| 6,469,489 B1 | * | 10/2002 | Bourquin et al. ........ 250/208.1 |

\* cited by examiner

*Primary Examiner*—Christopher W. Fulton
*Assistant Examiner*—Madeline Gonzalez
(74) *Attorney, Agent, or Firm*—William C. Schubert; Glenn H. Lenzen, Jr.

(57) ABSTRACT

In a first aspect of these teachings there is provided a radiation sensor that includes sensor optics having an entrance aperture and a two dimensional array of unit cells (10) spaced away from the aperture. Each unit cell includes a radiation detector (D1) having an output coupled to an input of a gain element, and each gain element is constructed so as to have at least one component with a value selected to set the gain of the gain element to a value that is a function of the unit cell's location along an x-axis and along a y-axis within the two dimensional array. In this manner a compensation is made for a variation of scene illumination across the two dimensional array, where the variation in scene illumination results from a relative intensity of the energy impinging on a unit area of the two dimensional array that varies, for example, by the fourth power of cosine $\theta$, where $\theta$ is an angle referenced to an optical axis of the radiation sensor. In a further aspect the radiation sensor includes a plurality of column readout circuits individual ones of which are switchably coupled to individual ones of the unit cells of one of the columns of unit cells. Each of the column readout circuits is constructed to have a first stage having a gain element with a-least one component that has a value selected to set the gain of the gain element to a value that is a function of the location of the column within the two dimensional array, and is further constructed to include a second stage having an input coupled to the first stage. The second stage includes a gain element having a gain that is varied as a function of a location within the two dimensional array of a row of unit cells that is being readout. In this case a combination of the gain of the first stage and the gain of the second stage compensates for a variation of scene illumination across the two dimensional array, where the variation in scene illumination results from the relative intensity of the energy impinging on the unit area of the two dimensional array that varies by the fourth power of cosine $\theta$.

13 Claims, 6 Drawing Sheets

STAGE 1: COLUMN CTIA        STAGE 2: DIFFERENTIAL VCCS

TWO DIMENSIONAL OPTICAL SHADING GAIN COMPENSATION FOR IMAGING SENSORS

TECHNICAL FIELD

These teachings relate generally to detectors of electromagnetic radiation and, more specifically, relate to focal plane arrays (FPAs) of infrared (IR) radiation detectors and to detectors responsive to other spectral bands, including the visible band.

BACKGROUND

Referring to FIG. 1 it can be seen that conventional imaging sensor optics do not uniformly illuminate a flat image plane 1 that contains a two dimensional array having rows and columns of detector pixels. When a circular entrance aperture 2A that is made through a cold/light shield structure 2B is illuminated by a uniform scene irradiance, the relative intensity of the energy falling on a unit area of the image plane 1 is given by the fourth power of cosine θ, where θ is an angle referenced to the optical axis 3 of the imaging sensor optics. As can be appreciated, the gain of the individual light detecting pixels located at the image plane 1 becomes an important consideration in order to compensate for the nonuniformity of the scene illumination across the image plane 1. Note that the focal length (fl) is shown as the distance from the entrance aperture 2A to the image plane 1.

One previous optical shading gain correction technique employs a voltage mode amplifier, typically a charge to voltage converter, that has fixed gain values set by adjusting the size of a capacitor or a resistor in the feedback path of an operational amplifier. While this technique works well for one-dimensional scanning-type image sensor arrays, it does not provide the required gain compensation in the two axes (x and y) of a staring-type image sensor, when the charge to voltage conversion is not performed in the detector's input amplifier. While it may be possible to extend the previous column-based gain correction technique to two dimensions, practical circuit limitations have made this approach difficult to implement.

Reference with regard to a column-based circuit chain that produces a signal with a corrective gain value can be made to U.S. Pat. No. : 6,288,387, Black et al., "Apparatus and Method for Performing Optical Signal Intensity Correction in Electro-Optical Sensor Arrays".

The $\cos^4 \theta$ induced shading gain illustrated in FIG. 1 has been manageable for relatively small format image sensors (e.g., 256×256 pixels) and below. However, the trend towards larger format image sensors, such as 640×480 and 1 kx 1 k and larger, has made the shading-induced gain nonuniformity problem more severe, and has significantly complicated the ability to compensate for the shading-induced gain nonuniformity.

It should be noted that the undesirable effects of the optical shading may be removed from the output electrical signal using nonuniformity correction digital circuitry. However, since the correction is performed after the analog output signal experiences analog-to-digital conversion, the signal to noise ratio (SNR) is degraded for those pixels that are located away from the center of the two dimensional array. This is, therefore, not a preferred technique for dealing with the optical shading problem.

It should be appreciated that the optical shading need not be limit ed to only $\cos^4 \theta$ induced shading from a circular aperture. In fact, it can be any arbitrary shading caused by optical aberrations.

SUMMARY OF THE PREFERRED EMBODIMENTS

The foregoing and other problems are overcome, and other advantages are realized, in accordance with the presently preferred embodiments of these teachings.

In accordance with a first aspect of these teachings there is provided a radiation sensor that includes sensor optics having an entrance aperture and a two dimensional array of unit cells spaced away from the entrance aperture. Each unit cell includes a radiation detector having an output coupled to an input of a gain element, and each gain element is constructed so as to have at least one component with a value selected to set the gain of the gain element to a value that is a function of the unit cell's location along an x-axis and along a y-axis within the two dimensional array. In this manner a compensation is made for a variation of scene illumination across the two dimensional array, where the variation in scene illumination results from a relative intensity of the energy impinging on a unit area of the two dimensional array that varies by the fourth power of cosine θ, where θ is an angle referenced to an optical axis of the radiation sensor.

In one embodiment the gain element includes a direct injection (DI) amplifier circuit that includes an integration capacitance $C_{int}$ and a sample and hold capacitance $C_{s/h}$, where the value of one or both of $C_{int}$ and $C_{s/h}$ is selected to set the gain of the DI amplifier circuit to a value that is a function of the unit cell's location within the two dimensional array of unit cells.

In a second embodiment the gain element includes a source follower per detector (SFD) amplifier circuit having an integration capacitance $C_{int}$, where the value of $C_{int}$ is selected to set the gain of the SFD amplifier circuit to a value that is a function of the unit cell's location within the two dimensional array of unit cells.

In a further embodiment the gain element includes a charge transimpedance amplifier (CTIA) circuit that includes an integration capacitance $C_{int}$ connected in a feedback path of the CTIA circuit, where the value of $C_{int}$ is selected to set the gain of the CTIA circuit to a value that is a function of the unit cell's location within the two dimensional array of unit cells.

In accordance with a further aspect of these teachings, where the two dimensional array of unit cells is arranged in y rows and x columns, the radiation sensor further includes a plurality of column readout circuits individual ones of which are switchably coupled to individual ones of the unit cells of one of the columns of unit cells. Each of the column readout circuits is constructed to have a first stage having a gain element with a least one component that has a value selected to set the gain of the gain element to a value that is a function of the location of the column within the two dimensional array, and is further constructed to include a second stage: having an input coupled to the first stage. The second stage includes a gain element having a gain that is varied as a function of a location within the two dimensional array of a row of unit cells that is being readout. In this case a combination of the gain of the first stage and the gain of the second stage compensates for a variation of scene illumination across the two dimensional array, where the variation in scene illumination results from the relative intensity of the energy impinging on the unit area of the two dimensional array that varies by the fourth power of cosine θ.

In a presently preferred embodiment the first stage gain element includes a charge transimpedance amplifier (CTIA) circuit that includes a feedback capacitance $C_{fb}$ connected in a feedback path of the CTIA circuit, and the second stage gain element includes a differential Voltage Controlled Current Source (VCCS) that converts a voltage output of the first stage CTIA to a current. The value of the feedback capacitance $C_{fb}$ is set according to the formula:

$$C_{fbi}=C_{fbo}\cos(\mathrm{atan}((|(x/2)-i+0.5|)/fl)),$$

where I=column number;
 fl=distance from the aperture to the two dimensional array;
 $C_{fbo}$=feedback capacitance with no illumination nonuniformity compensation; and
 x=the total number of columns;
and where the second stage differential VCCS current gain $G_m$ is given by the formula:

$$G_{mk}=(G_{gmo})/\cos(\mathrm{atan}((|(y/2)-k+0.5|)/fl)),$$

where k=row number;
 fl=distance from the aperture to the two dimensional array;
 $G_{gmo}$=voltage-current gain with no illumination nonuniformity compensation; and
 y=the total number of rows.

The differential VCCS may include a current output DAC that is digitally programmed as a function of a row address being readout.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIGS. 3A, 3B and 3C are each an embodiment of circuitry for providing optical shading correction in the input circuit array of FIG. 2, wherein FIG. 3A illustrates a voltage output direct injection circuit embodiment, FIG. 3B illustrates a source follower per detector circuit embodiment and FIG. 3C illustrates a Charge Transimpedance Amplifier (CTIA) circuit embodiment;

DETAILED DESCRIPTION OF THE PREFERRED EMBODIMENTS

By way of introduction, imaging sensors can be divided into two basic classes: those that perform charge to voltage conversion within the individual unit cells of each detector, and those that do not. Optical shading correction in accordance with these teachings can be performed for both classes of imaging sensors, and each employs a different solution.

Figure 1:
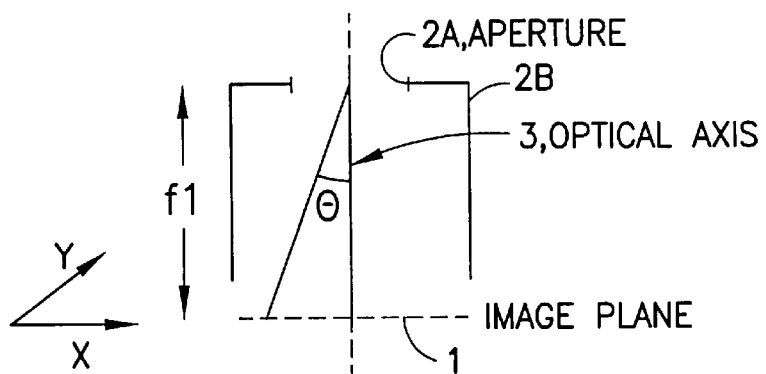
FIG. 1 is a simplified side view showing an image plane, an aperture and an angle θ, and is useful in explaining non-uniformity in gain due to the relative intensity of the energy falling on a unit area of the image plane 1 varying by the fourth power of cosine θ.
Figure 2:
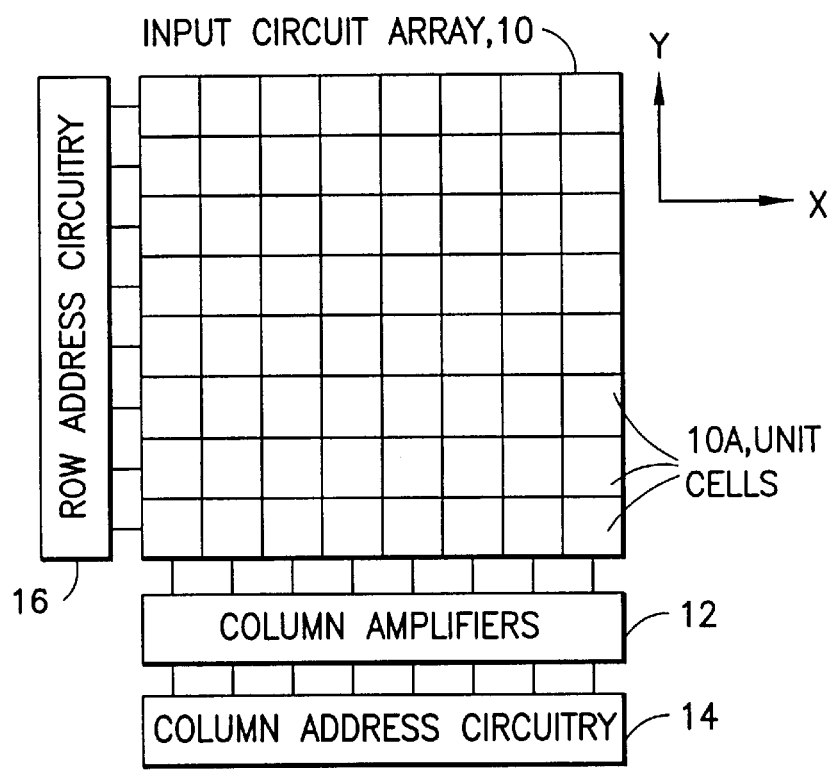
FIG. 2 is a simplified top view of a typical two dimensional imaging array having an input circuit array and associated row and column address circuitry and column amplifier circuitry.

In the first class of imaging sensors, where charge to voltage conversion is performed as part of the input or detector integration circuitry (i.e., within each unit cell 10A of the exemplary 8×8 input circuit array 10 shown in FIG. 2), the integration capacitance is varied on a pixel-by-pixel basis to provide a different gain for each input circuit to correct for the optical shading variation. This approach does not require that each unit cell 10A of the array 10 have a unique value of gain, but instead that the gain of the unit cells is varied in a controlled manner along the x and y axes of the input circuit array 10 so as to compensate for the nonuniformity in illumination due to the optical shading induced by the imaging sensor optics (not shown in FIG. 2).

Figure 3A:
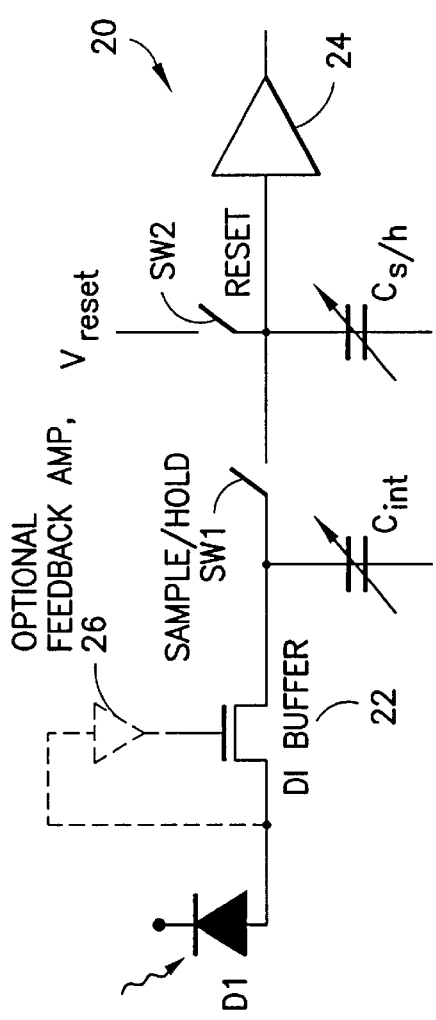
Figure 3B:
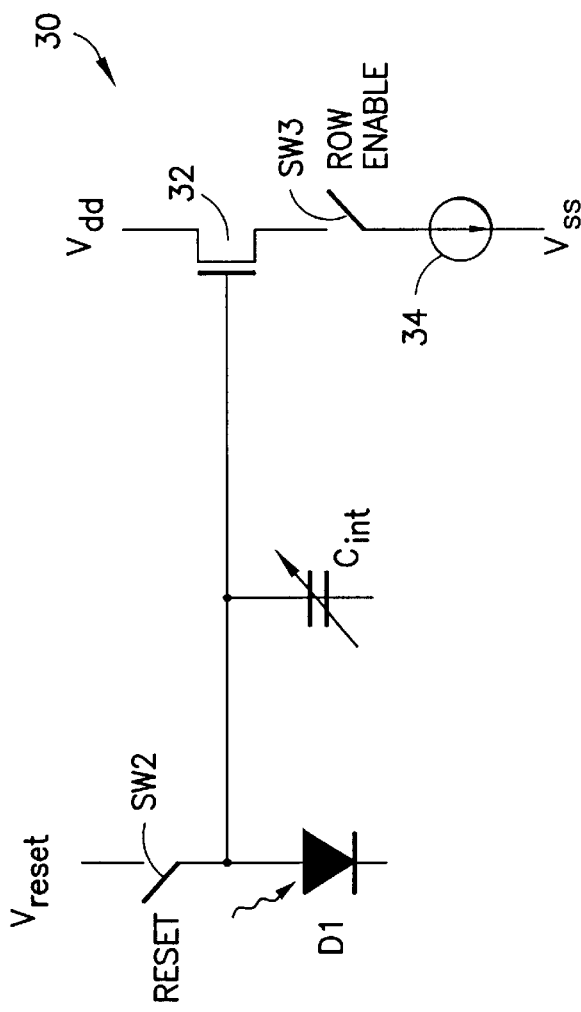
Figure 3C:
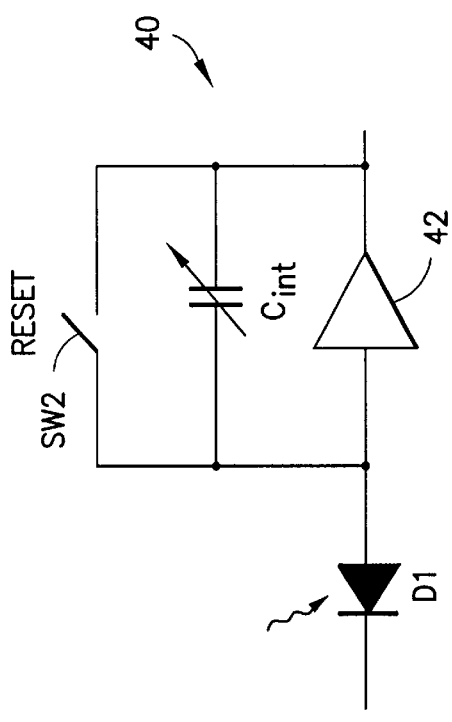

FIGS. 3A, 3B and 3C represent examples of input circuits to which this aspect of the invention applies. More particularly, FIG. 3A illustrates a voltage output, direct injection (DI) circuit 20, FIG. 3B illustrates a source follower per detector (SFD) circuit 30 and FIG. 3C illustrates a Charge Transimpedance Amplifier (CTIA) circuit 40. Each unit cell 10A of the array 10 of FIG. 2 is assumed to include one of the illustrated circuits, and the gain of each circuit is adjusted by varying the value of at least one capacitance within the unit cell 10A. In the preferred embodiment any one of a number of computer aided design (CAD) layout tools enables the values of the N×M different capacitors to be calculated and then translated into an equivalent integrated circuit structure that will yield the required value of capacitance. As is well known, the value of an integrated circuit capacitance can be set by establishing a certain conductor (plate) area, and/or by adjusting spacing between conductive layers and/or by a selection of dielectric material (s) that are deposited between the conductive layers.

In the DI circuit 20 of FIG. 3A a unit cell comprises a radiation detector, shown schematically, as a photoresponsive diode D1, that is coupled through a direct injection (DI) buffer transistor 22 to an integration capacitance $C_{int}$. A sample and hold switch SW1 periodically closes to sample the accumulated charge on $C_{int}$ onto a sample and hold capacitance $C_{s/h}$ at the input to an output buffer amplifier 24. A reset switch SW2 periodically connects $C_{s/h}$ to a reset voltage ($V_{reset}$). An optional feedback amplifier 26 may be coupled to the gate of the DI buffer transistor 22. In this embodiment the values of one or both of $C_{int}$ and $C_{s/h}$ is varied across the array 10 in order to compensate for the rolloff in illumination due to shading of the scene illumination.

In the SFD circuit 30 of FIG. 3B the reset switch SW2 periodically connects D1 and the integration capacitance $C_{int}$ to the reset voltage ($V_{reset}$). An output transistor 32 operated in a source follower mode is periodically coupled to a constant current source 34 through a row enable switch SW3. In this case the value of $C_{int}$ is varied across the array 10 in order to compensate for the rolloff in illumination due to shading. General reference with regard to the SFD circuit architecture can be had to U.S. Pat. No.: 5,083,016, Wyles et al., entitled "3-Transistor Source Follower-per-Detector Unit Cell for 2-Dimensional Focal Plane Arrays", wherein a SFD unit cell is constructed using three transistors. However, these teachings are not limited for use with the three transistor SFD topology. For example, these teachings can be applied as well to a four transistor SFD unit cell. Reference in this regard can be had to U.S. Pat. No.: 4,445,117, Gaalema et al., entitled "Transistorized Focal Plane Having Floating Gate Output Nodes".

In the CTIA circuit 40 of FIG. 3C the reset switch SW2 periodically closes around the integration capacitance $C_{int}$ that is connected in the feedback path of amplifier 42. In this embodiment the value of $C_{int}$ is varied across the array 10 in order to compensate for the rolloff in illumination due to shading. General reference with regard to the CTIA circuit architecture can be had to U.S. Pat. No.: 4,978,872, Morse et al., entitled "Integrating Capacitively Coupled Transimpedance Amplifier", as well as to U.S. Pat. No.: 5,043,820, Wyles et al., entitled "Focal Plane Array Readout Employing One Capacitive Feedback Transimpedance Amplifier for Each Column".

In all of these various embodiments the values of gain setting elements, such as capacitances or resistances, are varied across the array 10 in a controlled manner so as to compensate the output electrical signals of the array 10 for the nonuniformity of the scene illumination across the image plane 1.

In the second class of imaging sensors referred to above, i.e., those that do not perform charge to voltage conversion within the individual unit cells of each radiation detector, the array 10 instead stores charge in each unit cell 10A, and the gain is set by an external (to the array 10) column-based circuit. It is known in the art to provide for a horizontal-only type of shading compensation by varying the gain of column-based CTIA circuitry across the array 10. However, this conventional approach does not compensate for the shading-induced nonuniformity in the: vertical direction, and thus is not an optimum solution.

Figure 4:
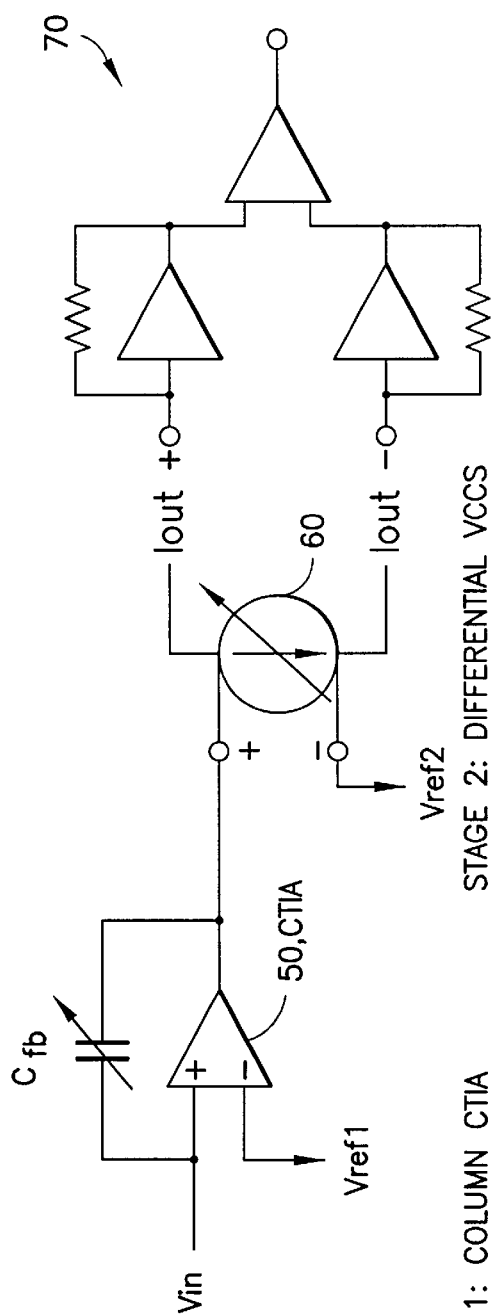
FIG. 4 is a circuit diagram of a presently preferred embodiment of a two stage amplifier for correcting two dimensional optical shading, where the second stage is constructed using a differential Voltage Controlled Current Source (VCCS)

Referring to FIG. 4, in accordance with a further aspect of these teachings a second stage differential VCCS 60 (where a CTIA 50 is considered the first stage) is used to generate a low power differential current mode output signal. The differential current signal that is output is converted to a voltage by external electronics, such as a resistive transimpedance amplifier 70, and then digitized. The current to voltage gain of the differential VCCS 60 is programmably adjusted on a row by row basis to provide the desired vertical image shading correction. It can be appreciated that providing an equivalent gain compensation in the column CTIA amplifier 50 would require some large number (e.g., hundreds) of unique sets of feedback capacitors for each column amplifier used, in addition to the digital support and selection logic. These teachings overcome this problem with one circuit that is combined with horizontal correction circuitry to provide an accurate two dimensional compensation for the two dimensional $\cos^4\theta$ shading pattern of a staring (as opposed to scanned) image sensor.

In accordance with these teachings the two dimensional compensation is achieved by adjusting the gain of two successive amplifiers, the CTIA 50 and the differential VCCS 60. The shading correction across a single row is achieved by adjusting the size of the CTIA feedback capacitance ($C_{fb}$) on a column-by-column basis. The CTIA 50 converts the integrated charge from a detector pixel unit cell 10A into a gain adjusted voltage signal. The gain adjusted voltage signal is then used as the input to the differential VCCS 60. The voltage to current gain of the differential VCCS 60 is adjusted on a row-by-row basis to compensate for shading along the columns of the array 10. The product of these two gain correction terms provides the desired full two dimensional shading correction.

Example A

Figure 5:
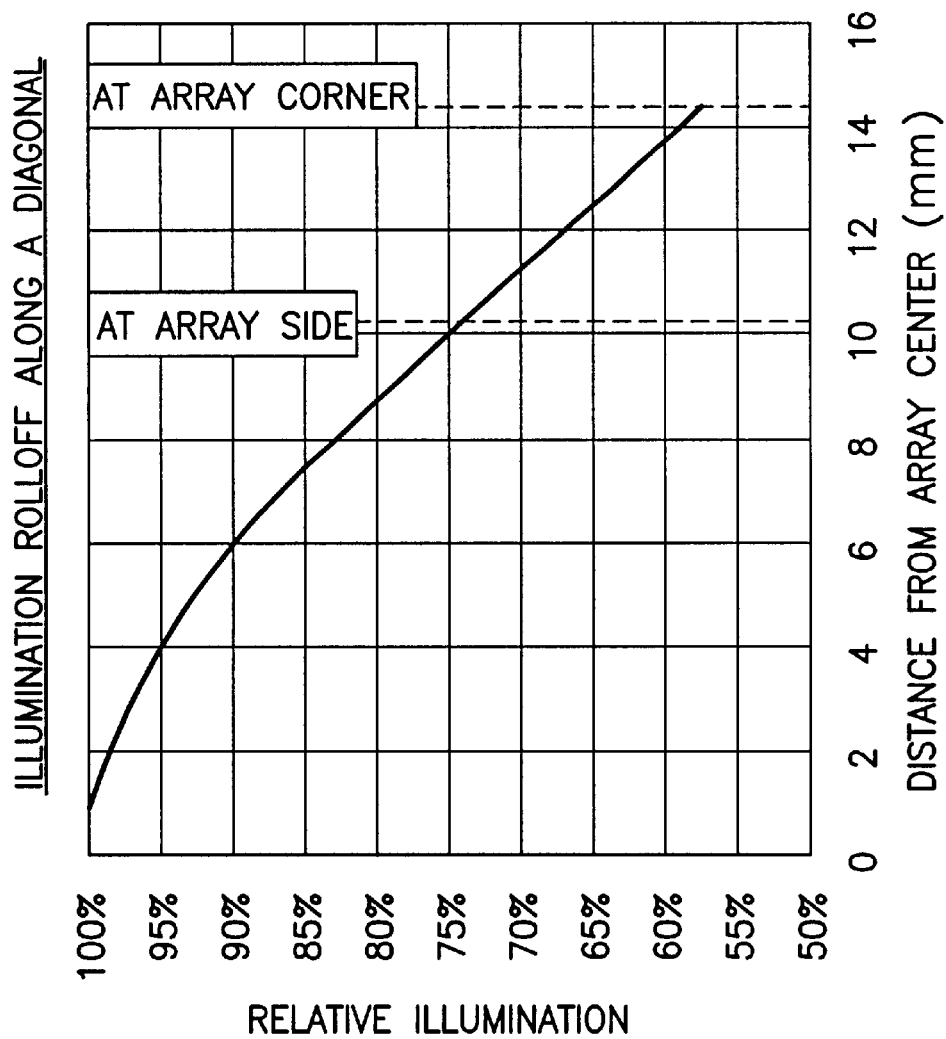
FIG. 5 is a graph that illustrates optical shading along a diagonal, also referred to as illumination rolloff, of an exemplary 1024×1024 pixel image sensor with a one inch focal length, and plots relative illumination versus distance from the center of the sensor array (mm)
Figure 6:
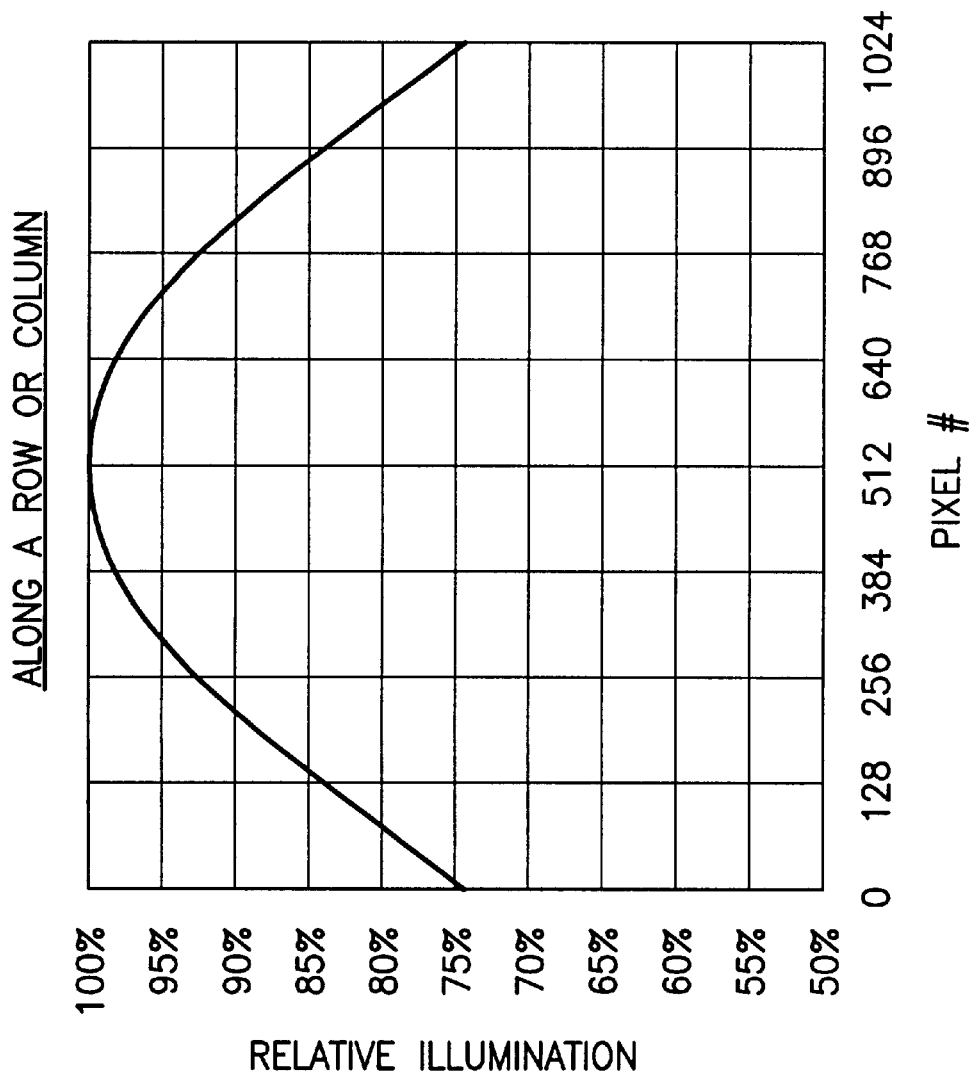
FIG. 6 is a graph that illustrates horizontal and vertical optical shading in the 1024×1024 pixel image sensor having the one inch focal length, and plots relative illumination versus pixel number along a row or a column.

An example is now provided for the gain correction assuming the use of a 1,024×1,024 image sensor with 20 micron by 20 micron square pixels that view a scene of interest through a circular optical aperture located one inch from the image plane. These particular parameters should not be viewed in a limiting sense upon the practice of this invention, as other numbers of pixels and pixel dimensions could be used, as could other focal lengths and aperture shapes. The $\cos^4\theta$ optical shading along an array diagonal for this example is depicted in FIG. 5, while the $\cos^4\theta$ optical shading from top to bottom (or side to side) is shown in FIG. 6.

For the first stage column CTIA 50 the feedback capacitance $C_{fb}$ is adjusted according to the following formula:

$$C_{fbi}=C_{fb}\cos(\mathrm{atan}((|(1024/2)-i+0.5|)/fl)),$$

where I=column number;

fl=distance from the aperture 2A to the focal plane 1; and $C_{fbo}$=feedback capacitance with no shading compensation.

In this example 1024 represents the total number of columns, in other embodiments more or less than 1024 columns may be present.

The second stage differential VCCS 60 current gain $G_m$ is given by the formula:

$$G_{mk}=(G_{gmo})/\cos(\mathrm{atan}((|(1024/2)-k+0.5|)/fl)),$$

where k=row number;

fl=distance from the aperture 2A to the focal plane 1; and $G_{gno}$=voltage-current gain with no shading compensation.

In this example 1024 represents the total number of rows, in other embodiments more or less than 1024 rows may be present.

The end result is the desired two dimensional compensation of the $\cos^4\theta$ optical shading along the y rows and the x columns of the input circuit array 10.

Figure 7:
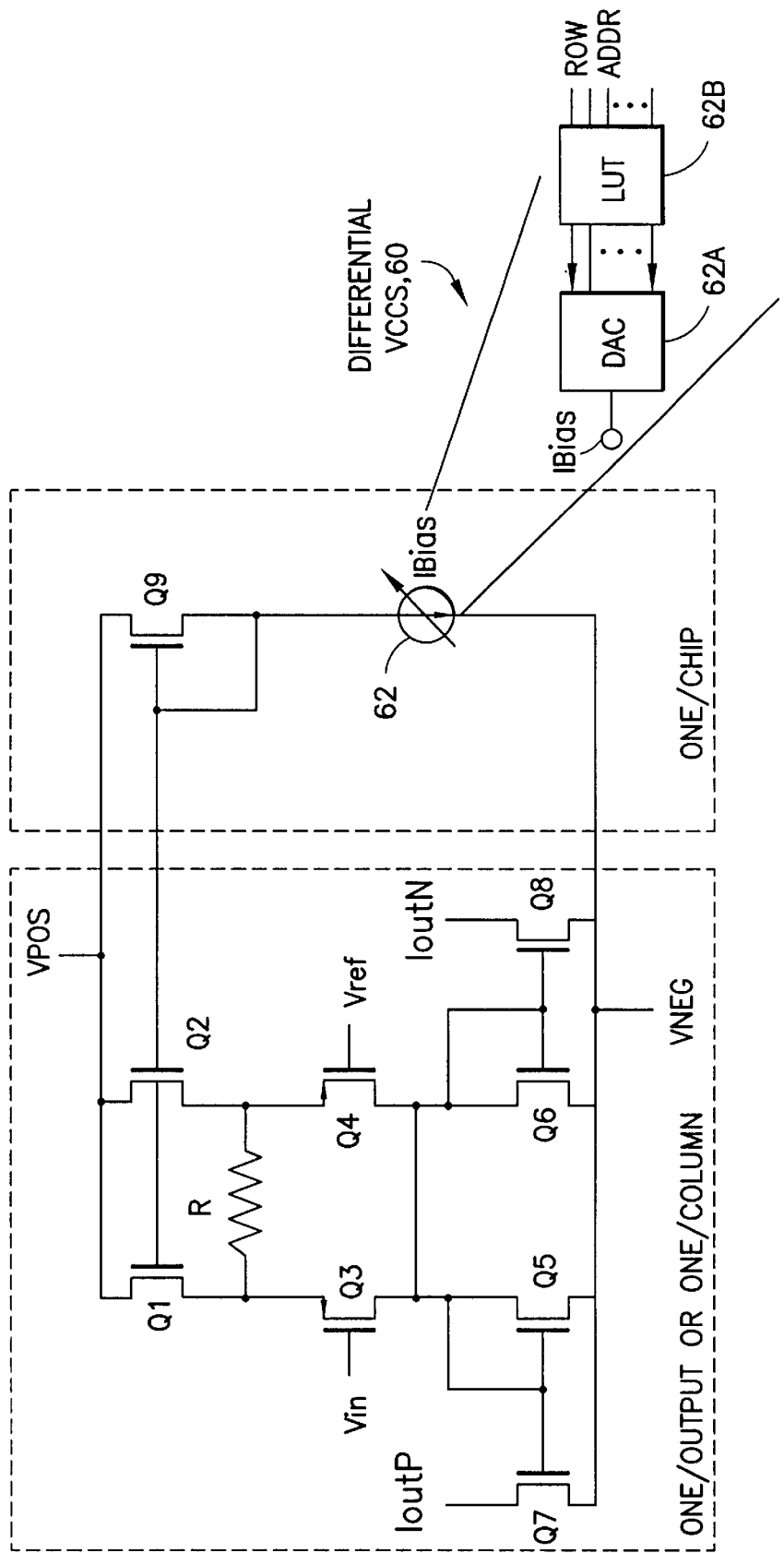
FIG. 7 is a more detailed schematic diagram of the differential Voltage Controlled Current Source (VCCS) of FIG. 4.

The differential VCCS 60 is shown in greater detail in FIG. 7. The amplifier composed of transistors Q1–Q8 and resistance R is connected between the positive and negative power supply rails VPOS and VNEG, respectively. The gate of Q3 receives the input voltage form the CTIA 50 while the gate of Q4 is connected to a reference voltage Vref, shown as Vref2 in FIG. 4. The differential current outputs Ioutp and IoutN are taken from Q7 and Q8, respectively. During operation the amplifier converts the single ended voltage input from the CTIA 50 into the differential current output. When Vin>Vref, IoutN>IoutP, when Vin=Vref, IoutN=IoutP and when Vin<Vref, IoutN<IoutP. The average value of IoutN and IoutP is set by the reference current source Ibias 62, the output of which is applied to the gate of Q1, Q2 and Q9. By adjusting the value of bias 62 the input voltage to output current gain is adjusted. Since the reference current bias is preferably globally generated (once per chip) rather than locally generated (in every column circuit), the current reference that supplies Ibias 62 may be implemented using a to current digital to analog converter (DAC) 62A. The value of the input bits of the DAC 62A for a given row of the array 10 may be decoded from the current row address that is required to be generated in order to multiplex the detector inputs to the outputs of the chip containing the array 10 and the related row and column address circuitry 12, 14 and 16. For example, a simple lookup table (LUT) 62B could be employed to decode a row address of the array 10 into a digital value that corresponds to a desired value of Ibias for that row. In a typical case it has been found that the value of Ibias may need to change by only about 0.2% from row to row of the array 10, and thus the settling time of the DAC or other programmable current source 62 can be readily accommodated during the output multiplexer idle time between successive row addresses.

In accordance with the foregoing teachings it can be appreciated that the first stage CTIA 50 for a particular column may have a predetermined value of $C_{fb}$ as a function of location in the x-axis direction from the center of the array 10, while the value of Ibias for the second stage differential VCCS 60 is programmably set to one of a plurality of values depending on a currently selected row (in the y-axis direction) to be read out of the array 10. The resistive transimpedance amplifier 70, or some other current to voltage converter, may then be used to convert the differential current signal to a corresponding shading-compensated voltage signal that is subsequently digitized and processed in a desired manner.

Further details of the design and operation of the circuits shown in FIGS. 3A, 3B and 3C are now provided in the following Examples.

Example B

In FIG. 3A, the transimpedance of the illustrated DI circuit 20 is given by:

$$Z_t = (q/C_{int})(C_{int}/(C_{int}+C_{s/h}))G_{amp} = (q/(C_{int}+C_{s/h}))G_{amp},$$

where q is the electron charge and $G_{amp}$ is the gain of the amplifier 24. The gain would be adjusted by scaling both $C_{int}$ and $C_{s/h}$ by the following factor:

$$C_{i,k} = C_o \cos(\tan^{-1}(\mathrm{sqrt}((x/2-i+0.5)^2+(y/2-k=0.5)^2)/fl)),$$

where x is the total number of columns, i is the column number, fl is the distance from the aperture to the two dimensional array, and $C_o$ is the capacitor with no illumination nonuniformity compensation.

Again, it should be noted that the gain adjustment values given above are for the special case of non-uniformity caused by an illumination profile generated by a light shield with a circular aperture in front of the two dimensional imager array. In principle, a more general and accurate shading correction may be achieved by generating a table of correction values from relative illumination data generated by an optical design software package. One suitable, but not limiting, type of optical design software package is one known in the art as Code5(tm) available from Optical Research Associates.

Example C

For the SFD circuit 30 of FIG. 3B the transimpedance is given by:

$$Z_t = (q/(C_{int}+C_{det}))G_{sf},$$

where q is the electron charge and $G_{sf}$ is the gain of the source follower 32. In this case $C_{det}$ cannot be changed, so the gain is adjusted by varying only $C_{int}$. This can be done by scaling $C_{int}$ by the following factor:

$$C_{i,k} = C_o \cos(\tan^{-1}(\mathrm{sqrt}((x/2-i+0.5)^2+(y/2-k=0.5)^2)/fl)) - C_{det},$$

where x is the total number of columns, i is the column number, fl is the distance from the aperture to the two dimensional array, and $C_o$ is the sum of $C_{det}$ and Cint with no illumination non-uniformity compensation.

Example D

For the CTIA circuit 40 shown in FIG. 3C the transimpedance is given by the following equation:

$$Z_t = q/C_{int},$$

where q is the electron charge. In this case the same equation used for the DI circuit 20 can be used to vary $C_{int}$, i.e.:

$$C_{i,k} = C_o \cos(\tan^{-1}(\mathrm{sqrt}((x/2-i+0.5)^2+(y/2-k=0.5)^2)/fl)),$$

where x is the total number of columns, i is the column number, fl is the distance from the aperture to the two dimensional array, and $C_o$ is the integration capacitor $C_{int}$ with no illumination non-uniformity compensation.

One suitable CAD program that can be used to layout the capacitors is one known as a Virtuoso Layout Editor(tm) that is available from Cadence Design Systems, which provides a programming language referred to as Skill(tm) that can be used to automate many tasks, including the automatic layout of capacitors for image shading correction in accordance with the teachings of this invention.

While described in the context of preferred embodiments of these teachings, it should be appreciated by those skilled in the art that modifications could be made to these embodiments, and that these modifications would still fall within the scope of this invention. For example, these teachings apply to arrays of unit cells constructed to be responsive to IR, as well as to those constructed to be responsive to visible light and to light in other spectral bands.

What is claimed is:

1. A radiation sensor comprising sensor optics having an entrance aperture and a two dimensional array of unit cells spaced away from said aperture, each said unit cell comprising a radiation detector having an output coupled to an input of a gain element, each gain element comprising a least one component having a value selected to set the gain of said gain element to a value that is a function of the unit cell's location along an x-axis and along a y-axis within said two dimensional array for compensating for a variation of scene illumination across said two dimensional array, where the variation in scene illumination results from a relative intensity of the energy impinging on a unit area of the two dimensional array.

2. A radiation sensor as in claim 1, wherein said gain element comprises a direct injection (DI) amplifier circuit that includes an integration capacitance $C_{int}$ and a sample and hold capacitance $C_{s/h}$, wherein the value of one or both of $C_{int}$ and $C_{s/h}$ is selected to set the gain of said DI amplifier circuit to a value that is a function of the unit cell's location within the two dimensional array of unit cells.

3. A radiation sensor as in claim 1, wherein said gain element comprises a source follower per detector (SFD) amplifier circuit that includes an integration capacitance $C_{int}$, where the value of $C_{int}$ is selected to set the gain of said SFD amplifier circuit to a value that is a function of the unit cell's location within the two dimensional array of unit cells.

4. A radiation sensor as in claim 1, wherein said gain element comprises a charge transimpedance amplifier (CTIA) circuit that includes an integration capacitance $C_{int}$ connected in a feedback path of said CTIA circuit, where the value of $C_{int}$ is selected to set the gain of said CTIA circuit to a value that is a function of the unit cell's location within the two dimensional array of unit cells.

5. A radiation sensor as in claim 1, wherein the relative intensity of the energy impinging on the unit area of the two dimensional array varies by the fourth power of cosine θ, where θ is an angle referenced to an optical axis of said radiation sensor.

6. A radiation sensor comprising sensor optics having an entrance aperture and a two dimensional array of unit cells arranged in y rows and x columns of unit cells and spaced away from said aperture, each said unit cell comprising a radiation detector having an output coupled to an input of a gain element, said radiation sensor further comprising a plurality of column readout circuits individual ones of which are switchably coupled to individual ones of unit cells of one of said columns of unit cells, each said column readout circuit comprising a first stage having a gain element comprising a least one component having a value selected to set the gain of said gain element to a value that is a function of the location of the column within said two dimensional array, and a second stage having an input coupled to said first stage, said second stage comprising a gain element having a gain that is varied as a function of a location within said two dimensional array of a row of unit cells that is being readout, wherein a combination of the gain of said first stage and a gain of said second stage compensates for a variation of scene illumination across said two dimensional array, where the variation in scene illumination results from a relative intensity of the energy impinging on a unit area of the two dimensional array.

7. A radiation sensor as in claim 6, wherein said first stage gain element is comprised of a charge transimpedance amplifier (CTIA) circuit that includes a feedback capacitance $C_{fb}$ connected in a feedback path of said CTIA circuit, where the value of $C_{fb}$ is selected to set the gain of said CTIA circuit to a value that is a function of the location of the column of the unit cell within the two dimensional array of unit cells.

8. A radiation sensor as in claim 6, wherein said second stage gain element is comprised of a differential Voltage Controlled Current Source (VCCS) that converts a voltage output of said first stage to a current having a magnitude that is a function of the location within said two dimensional array of the row of unit cells that is being readout.

9. A radiation sensor as in claim 6, wherein said first stage gain element is comprised of a charge transimpedance amplifier (CTIA) circuit that includes a feedback capacitance $C_{fb}$ connected in a feedback path of said CTIA circuit, wherein said second stage gain element is comprised of a differential Voltage Controlled Current Source (VCCS) that converts a voltage output of said first stage CTIA to a current, wherein the value of the feedback capacitance $C_{fb}$ is set according to the formula:

$$C_{fbi}=C_{fbo}\cos(\mathrm{atan}((|(x/2)-i+0.5|)/fl)),$$

where I=column number;
fl=distance from the aperture to the two dimensional array;
$C_{fbo}$=feedback capacitance with no illumination nonuniformity compensation; and
x=the total number of columns;
and wherein the second stage differential VCCS current gain $G_m$ is given by the formula:

$$G_{mk}=(G_{gmo})/\cos(\mathrm{atan}((|(y/2)-k+0.5|)/fl)),$$

where k=row number;
fl=distance from the aperture to the two dimensional array;
$G_{gmo}$=voltage-current gain with no illumination nonuniformity compensation; and
y=the total number of rows.

10. A radiation sensor as in claim 6, wherein said second stage gain element is comprised of a differential Voltage Controlled Current Source (VCCS) that converts a voltage output of said first stage to a current having a magnitude that is a function of the location within said two dimensional array of the row of unit cells that is being readout, said differential VCCS comprising a current output DAC that is digitally programmed as a function of a row address being readout.

11. A radiation sensor as in claim 6, wherein the relative intensity of the energy impinging on the unit area of the two dimensional array varies by the fourth power of cosine θ, where θ is an angle referenced to an optical axis of said radiation sensor.

12. A method for operating a radiation sensor comprising sensor optics having an entrance aperture and a two dimensional array of unit cells arranged in y rows and x columns of unit cells and spaced away from said aperture, where each said unit cell comprises a radiation detector having an output coupled to an input of a gain element and where said radiation sensor further comprises a plurality of column readout circuits individual ones of which are switchably coupled to individual ones of unit cells of one of said columns of unit cells, comprising:

reading out to said plurality of column readout circuits a signal from individual ones of unit cells corresponding to a row of unit cells;

amplifying in a first stage of each of said column readout circuits the readout signal with a gain selected to have a value that is a function of the location of the column within said two dimensional array; and amplifying in a second stage of each of said column readout circuits the amplified output of said first stage, each said second stage having a gain that is varied as a function of a location within said two dimensional array of the row of unit cells that is being readout.

13. A method as in claim 12, wherein a combination of the gain of said first stage and a gain of said second stage compensates for a variation of scene illumination across said two dimensional array, where the variation in scene illumination results from a relative intensity of the energy impinging on a unit area of the two dimensional array that varies by the fourth power of cosine θ, where θ is an angle referenced to an optical axis of said radiation sensor.

* * * * *